United States Patent
Gabriel

(10) Patent No.: US 6,811,956 B1
(45) Date of Patent: Nov. 2, 2004

(54) LINE EDGE ROUGHNESS REDUCTION BY PLASMA TREATMENT BEFORE ETCH

(75) Inventor: Calvin T. Gabriel, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 163 days.

(21) Appl. No.: 10/178,088

(22) Filed: Jun. 24, 2002

(51) Int. Cl.[7] .............................. G03F 7/00; H05H 1/24
(52) U.S. Cl. ...................... 430/313; 430/328; 430/317; 430/318; 430/30; 427/569; 427/570
(58) Field of Search ................................ 430/313, 328, 430/317, 318, 30; 427/569, 570

(56) References Cited

U.S. PATENT DOCUMENTS

| | | | |
|---|---|---|---|
| 6,218,693 B1 * | 4/2001 | Lu | 257/296 |
| 6,340,556 B1 * | 1/2002 | Wong | 430/296 |
| 6,423,457 B1 * | 7/2002 | Bell | 430/30 |

* cited by examiner

Primary Examiner—John A. McPherson
Assistant Examiner—Daborah Chacko-Davis
(74) Attorney, Agent, or Firm—Amin & Turocy, LLP

(57) ABSTRACT

One aspect of the present invention relates to a system and method for mitigating LER as it may occur on short wavelength photoresists. The method involves forming a short wavelength photoresist over a substrate having at least one dielectric layer formed thereon, exposing the photoresist to a plasma selective to the photoresist to strengthen the photoresist without substantially etching the at least one dielectric layer, the plasma comprising hydrogen, helium and argon, and etching the dielectric layer through openings of the strengthened photoresist with an etchant selective to the at least one dielectric layer, whereby the treated photoresist is substantially resistant to etching effects of the etchant. The system includes a photoresist monitor system for monitoring the plasma treatment to determine whether the photoresist has been strengthened and for adjusting parameters associated with the plasma treatment and for providing feedback to the plasma treatment system.

26 Claims, 10 Drawing Sheets

LINE EDGE ROUGHNESS REDUCTION BY PLASMA TREATMENT BEFORE ETCH

TECHNICAL FIELD

The present invention generally relates to processing a semiconductor substrate. In particular, the present invention relates to mitigating line-edge roughness along sidewalls of structures formed on a semiconductor substrate.

BACKGROUND ART

Achieving the objectives of miniaturization and higher packing densities continue to drive the semiconductor manufacturing industry toward improving semiconductor processing in every aspect of the fabrication process. Several factors and variables are involved in the fabrication process. For example, at least one and typically more than one photolithography process may be employed during the fabrication of a semiconductor device. Each factor and variable implemented during fabrication must be considered and improved in order to achieve the higher packing densities and smaller, more precisely formed semiconductor structures.

In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, X-rays, or an electron beam) illuminates selected areas of the surface through an intervening master template, the photoresist mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photoresist mask causes a chemical transformation in the exposed areas of the coating thereby making the image area either more or less soluble (depending on the coating) in a particular solvent developer. The more soluble areas are removed in the developing process to leave the pattern image in the coating as less soluble polymer. The resulting pattern image in the coating, or layer, may be at least one portion of a semiconductor device that contributes to the overall structure and function of the device.

Because the photoresist is used to form features on the semiconductor devices, the integrity of the photoresist must be maintained throughout the lithography process. That is, any flaw or structural defect which is present on a patterned photoresist may be indelibly transferred to underlying layers during a subsequent etch process wherein the photoresist is employed.

One example of an undesirable structural defect is line-edge roughness (LER). LER refers to the variations on the sidewalls of features which may originate from LER in the patterned photoresist. LER in photoresists can be caused by various factors such as LER on chrome patterns residing on the reticle, image contrast in a system for generating the photoresist pattern, a plasma etch process which can be used to pattern the photoresist, natural properties and/or weaknesses of the photoresist materials, and the photoresist processing method.

In addition, LER appearing in fabricated structures can occur as a result of damage to the patterned photoresist during an etch process, as illustrated in a partially fabricated semiconductor structure 10 in Prior Art FIG. 1. The semiconductor structure 10 includes a silicon substrate 20, a dielectric layer 30, and a photoresist layer 40 formed over the dielectric layer 30. As shown, plasma etchants employed to bombard exposed portions of the dielectric layer 30 through a patterned photoresist 40 inevitably attack the relatively soft photoresist material 50. In addition to removing exposed portions of the metalized layer, the energetic and reactive plasma species may alter the properties of the photoresist material, thus leading to LER 60 in the photoresist. The plasma effects can be more serious for 193 nm photoresists, which have less etch resistance than resists used at higher wavelengths such as 248 nm, 365 nm, etc. The condition may even worsen for wavelengths below 193 nm, such as 157 nm photoresists.

Moreover, as feature size decreases, line-edge roughness can interfere with accurate metrology and adversely affect device performance.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a novel monitoring system and method for enhancing consistency in photoresist material, thereby mitigating the occurrence of LER in photoresists. More specifically, the present invention provides a method to strengthen short wavelength photoresist films (e.g., 157 nm and 193 nm photoresists) before the short wavelength photoresist is used to etch exposed portions of an underlying dielectric layer. For example, after a short wavelength photoresist layer has been patterned with 193 nm or lower radiation, the patterned photoresist is exposed to and treated with a plasma under process conditions which are chosen to strengthen the photoresist rather than to etch the photoresist or any other layer exposed to the plasma treatment. This is accomplished in part by utilizing a plasma including at least one of helium (He), hydrogen ($H_2$) and argon (Ar), or a combination thereof.

In particular, an image, which may correspond to any of a number of semiconductor structures (e.g., damascene trench, conductive line, gate, contact, and the like), is patterned onto a short wavelength photoresist using 193 nm or lower radiation. The layers of material beneath the photoresist are not etched during the patterning of the photoresist. After the short wavelength photoresist has been patterned, the patterned photoresist may be treated with a plasma in order to strengthen the photoresist without adversely affecting or etching any layer exposed to the plasma. Strengthening the photoresist before it is employed to etch portions of exposed, underlying layer mitigates the occurrence of line edge roughness (LER) in the photoresist, thereby mitigating mal-formed features in the underlying layer.

One aspect of the present invention relates to a method for mitigating LER. The method involves providing a semiconductor substrate having at least one dielectric layer formed thereon. A photoresist layer having a thickness from about 500 angstroms to about 5000 angstroms may be formed over the dielectric layer. An image can be patterned on the photoresist layer using short wavelength radiation, thereby exposing portions of the dielectric layer. Short wavelength radiation specifically includes about 193 nm light and about 157 nm light or less. The image may, for example, correspond to one or more trenches. After the photoresist has been patterned and before the exposed portions of the dielectric layer are etched through openings of the photoresist, the photoresist is exposed to a plasma selective to the patterned photoresist layer to strengthen the photoresist layer without substantially etching the exposed dielectric layer. The plasma may comprise at least one of helium, hydrogen and argon, or a combination thereof. Once treated, the exposed portions of the dielectric layer can be etched through the openings of the treated photoresist layer with an etchant selective to the dielectric layer. As a result of the plasma treatment, the treated photoresist layer is substantially resistant to the etching effects of the etchant, thereby mitigating the occurrence of LER in the photoresist.

Another aspect of the present invention relates to a method for mitigating the occurrence of LER during fabrication of a semiconductor device. The method involves forming a short wavelength photoresist layer over one or more dielectric layers, which are formed on a semiconductor substrate. The photoresist layer has a thickness from about 500 angstroms to about 5000 angstroms. The photoresist layer is patterned using about 193 nm or less wavelength radiation, thus exposing selected portions of the one or more underlying dielectric layers. Prior to etching the dielectric layer through openings of the patterned photoresist, the patterned photoresist undergoes a plasma treatment, which includes exposure to at least one of helium and argon, or a combination thereof. Exposure to the plasma treatment strengthens the patterned photoresist layer, making it resistant to the etching effects of etchants used in subsequent etch processes (e.g, to etch dielectric layers). However, the plasma treatment does not substantially etch the exposed portions of the dielectric layer or any other layer which may be exposed to it. The dielectric layer can be etched through the treated photoresist layer with an etchant, the etching effects of which do not substantially affect the treated patterned photoresist. Thus, the occurrence of LER during semiconductor fabrication is mitigated. Following the etch process, the treated photoresist layer can be stripped from the one or more underlying dielectric layers.

Yet another aspect of the present invention relates to a method for mitigating LER in situ during fabrication of a semiconductor device. The method includes forming a patterned photoresist layer over a semiconductor substrate having a silicon dioxide layer formed thereon. The patterned photoresist layer is formed using radiation no greater than 193 nm. At least a portion of the photoresist layer is patterned to expose portions of the silicon dioxide layer. After the photoresist is patterned and before the silicon dioxide layer is etched, the patterned photoresist layer is exposed to a plasma selective to the photoresist layer for a time sufficient to strengthen the photoresist and to make it resistant against etchants subsequently employed to remove portions of the silicon dioxide layer.

During this exposure, no other layers are etched or structurally altered by the plasma. The plasma may be at least one of hydrogen, helium and argon, or a combination thereof. It should be understood that the plasma is not employed as etchant or under etch process conditions. Following the plasma treatment and before the strengthened photoresist is used to etch the dielectric layer, a determination can be made as to whether the photoresist layer has been strengthened and/or affected by the plasma treatment. A photoresist monitor system may be employed to make this determination. The photoresist monitor system may also adjust parameters associated with the plasma treatment in order to increase the effectiveness and efficiency of the plasma treatment. An etchant is employed to etch the dielectric layer through the openings of the strengthened photoresist, whereby the etchant is selective to the dielectric layer. Moreover, the strengthened photoresist is resistant to the etching effects of the etchant and of subsequent etchants.

Still yet another aspect of the present invention relates to a method for mitigating LER in situ during fabrication of a damascene trench on a semiconductor device. The method involves forming a patterned photoresist layer over a semiconductor substrate having one or more dielectric layers deposited and formed thereon. At least a portion of the photoresist layer is patterned with short wavelength radiation no greater than 193 nm. The patterned photoresist layer is exposed to a plasma selective to the photoresist layer for a time sufficient to strengthen the photoresist and to make it resistant against subsequent etchants. During this exposure, no other layers are etched or significantly altered by the plasma. The plasma may be at least one of hydrogen, helium and argon, or a combination thereof. It should be understood that the plasma is not employed as etchant or under etchant process conditions and it is not intending to act or serve as an etchant. Using a photoresist monitor system, it can be determined whether the photoresist layer has been strengthened and/or whether it has been strengthened to a suitable level to be resistant to subsequent etching effects. The photoresist monitor system determines this by transmitting a pulse at or onto the photoresist layer, receiving the reflected pulse response from the photoresist layer and analyzing the reflected pulse response to determine a strength level of the photoresist layer and/or whether it has been strengthened (e.g., a "yes/no" form of a response).

Following an etch process wherein the strengthened photoresist layer is employed, the photoresist layer may be stripped from the one or more dielectric layers. A conformal barrier layer may be deposited over the dielectric layer and polished back such that selected portions of the barrier layer are removed from a top surface of the dielectric layers. The trench(es) may be filled with a suitable conductive material.

Still yet another aspect of the present invention relates to a system for mitigating the occurrence of LER in situ during fabrication of a semiconductor. The system contains a semiconductor wafer, on which at least one dielectric layer is formed. The wafer also includes a short wavelength photoresist layer formed over the dielectric layer which has been patterned using 193 nm or lower radiation and strengthened by a plasma treatment. The wafer may be located within a chamber, which is operatively connected to a photoresist monitoring system. The photoresist monitoring system transmits pulses onto the photoresist layer and receives reflected pulse responses from the patterned photoresist layer—which is the upper most layer and surface of the wafer. When exposed to a plasma treatment, which is controlled and regulated by the photoresist monitoring system, the patterned photoresist is structurally or physically altered such that reflected signals from a strengthened photoresist layer exhibit different characteristics than a non-treated (e.g., non-strengthened) photoresist layer. The photoresist monitoring system transmits an indicator to the system when the photoresist is substantially strengthened. Results of the signal reception from the photoresist and/or the indicator from the monitor can be displayed or communicated to an output device coupled thereto.

A plasma treatment system is operatively coupled to the photoresist monitoring system and to one or more plasma treatment components. The plasma treatment system receives feedback information from the photoresist monitoring system as it relates to the patterned photoresist layer. In particular, feedback information from the photoresist monitoring system corresponds to whether the photoresist is strengthened by the previous or most recent plasma treatment. Depending on the feedback information, the plasma treatment system may signal the one or more plasma treatment components to perform another treatment on the photoresist layer. In addition, the plasma treatment system may adjust one or more plasma treatment parameters according to the feedback information.

DISCLOSURE OF INVENTION

Figure 1:
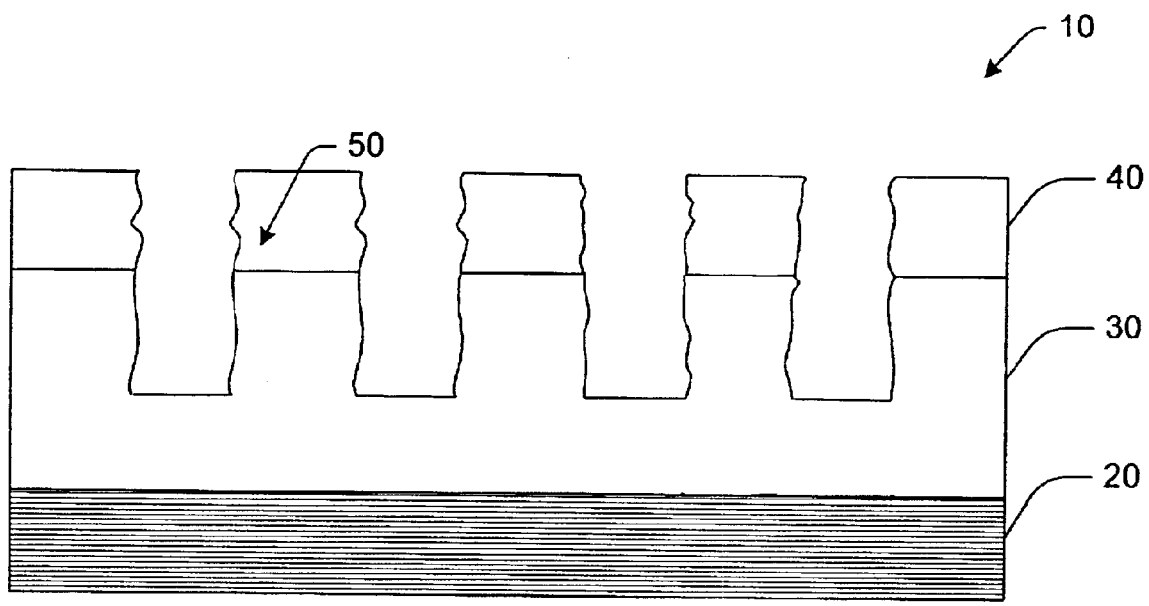
FIG. 1 illustrates a schematic cross-section of a partially fabricated semiconductor device according to the prior art.

The present invention involves a system and method for mitigating the occurrence of line-edge roughness (LER) on semiconductor devices. More specifically, the present invention involves a system and method for mitigating the occurrence of LER on short wavelength photoresists which may occur during a dielectric etch process. Pitting, thickness loss, faceting and complete premature removal or loss of the photoresist may also be mitigated by the present invention.

Mitigating the occurrence of LER is accomplished in part by patterning a photoresist using short wavelength radiation and then exposing the patterned photoresist to a plasma. The short wavelength radiation may be 193 nm or lower radiation. The plasma is not an etchant but rather transforms the patterned photoresist material, thereby strengthening it against the bombardment of etchants typically employed during a subsequent etch process. In addition, the plasma is selective to the photoresist layer and under the appropriate conditions, does not substantially etch, remove or damage any other layer that may be exposed to it.

The etchant or etchants chosen to etch the dielectric layer through an untreated photoresist may be attacking the photoresist material indirectly; however, because the photoresist has been strengthened by the plasma, it becomes resistant to the etching effects of the etchant. Thus, once the patterned photoresist is strengthened, it can be effectively utilized in a subsequent etch process. The treated photoresist may be removed as desired following conventional stripping techniques.

According to another aspect of the present invention, a photoresist monitor system can be utilized to control the plasma treatment and to determine the strength of the photoresist against subsequent etchants. In particular, the photoresist monitor system may be operatively connected to a plasma treatment chamber and to an output device or instrument and located with respect to a subject wafer such that the monitor may transmit pulses to (e.g., at least one pulse) and receive reflected pulse responses (e.g., at least one reflected pulse response) from the subject wafer. The transmitted and reflected pulses may be in the form of light at a suitable wavelength and/or sound at a suitable frequency. The transmitted pulse may be recorded by the monitor or some other data recorder internal or external to the monitor. Similarly, the reflected pulse response may also be recorded. Because the plasma treatment transforms the photoresist material, a reflected pulse response from a strengthened photoresist layer has a different appearance than a reflected pulse response received from a non-strengthened photoresist layer. Thus, a user can differentiate between a strengthened photoresist and a non-strengthened photoresist by measuring and analyzing the reflected pulse responses.

In addition, the photoresist monitor system operates to signal the plasma treatment system via feedback control. Such signals may indicate to the plasma treatment system to apply another treatment to the photoresist either under the same treatment conditions as the prior one or under amended conditions (e.g., plasma power, gas choice or flow rate, pressure, temperature, duration), adjustments to which are controlled by the photoresist monitor system and/or the plasma treatment system. Likewise, the photoresist monitor system also operates to terminate further plasma treatments on the subject wafer when it determines that the photoresist has been substantially strengthened. Once the patterned photoresist is substantially strengthened, the wafer can be etched through the openings of the patterned photoresist. The present invention may be further described with respect to a wafer undergoing a semiconductor processing to form a damascene trench therein as illustrated in FIGS. 2–14 below.

Figure 2:
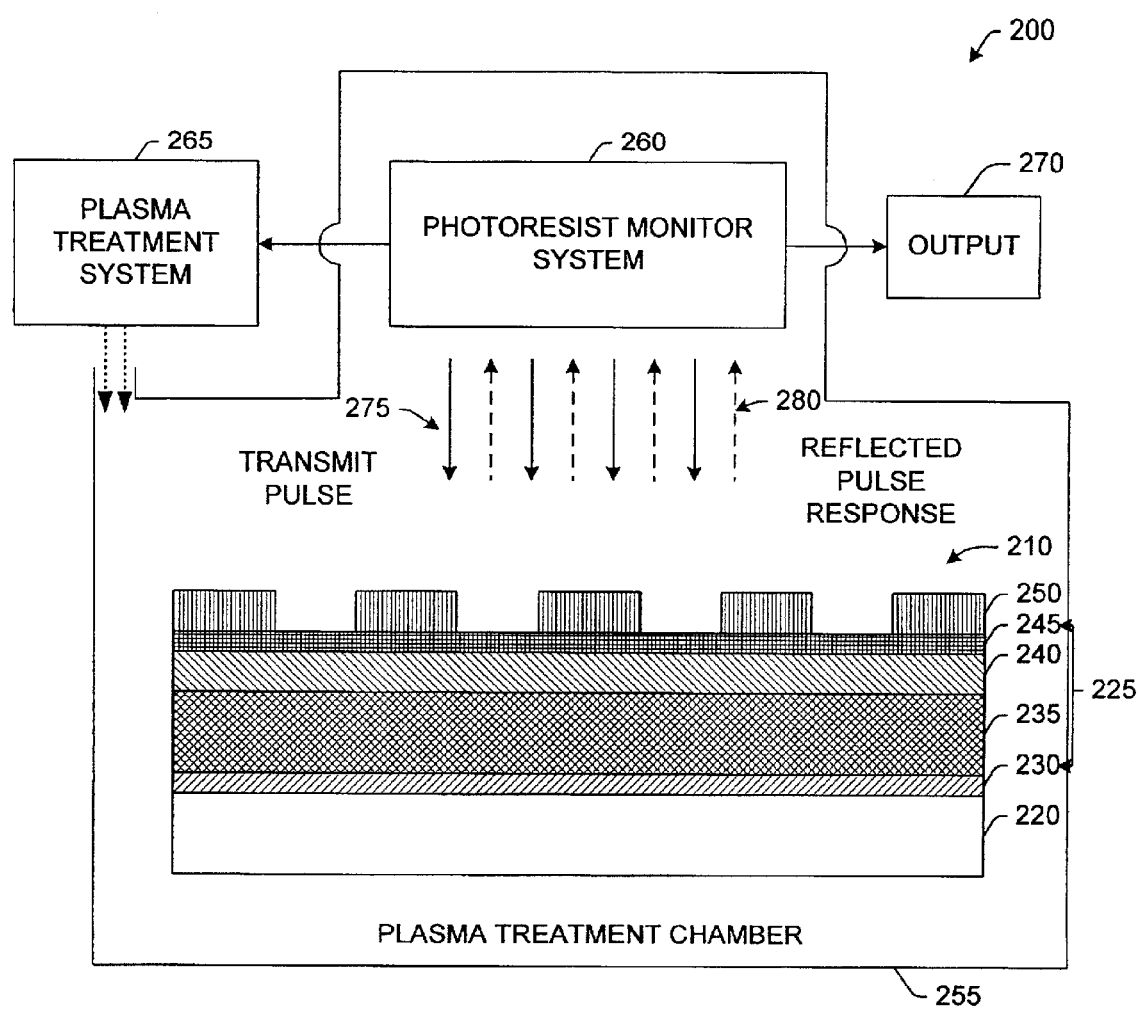
FIG. 2 illustrates a high-level, schematic block diagram of a semiconductor structure according to another aspect of the present invention.

FIG. 2 depicts a high level, schematic block illustration of a system 200 for mitigating the occurrence of LER during fabrication of a semiconductor device. The system 200 includes a partially fabricated semiconductor structure 210 having a silicon or polysilicon substrate 220 and a series of dielectric layers 225. The series of dielectric layers 225 comprise a silicon carbonitride layer 230 (SiCN), a silicon oxycarbide layer 235 (SiOC:H), a silicon dioxide layer 240 (SiO₂), and a silicon oxynitride layer 245 (SiON). However, it should be understood that the structure 210 may comprise at least one dielectric layer and one or more dielectric layers not necessarily arranged in the order described above. The upper most layer on the structure 210 is a short wavelength photoresist layer 250 which has been patterned with an image corresponding to a trench formation using 193 nm or less radiation.

The structure 210 is located within a plasma treatment chamber 255. The plasma treatment chamber may be an integral part of a main chamber used during semiconductor processing or it may be an independent station placed within a semiconductor processing apparatus, such that in either format, the chamber may be employed in situ with respect to the semiconductor fabrication process. The system 200 also includes a photoresist monitor system 260 operatively coupled to a plasma treatment system 265 and an output device 270. The photoresist monitor system 260 facilitates mitigating LER on photoresists and on semiconductor structures overall by determining whether the photoresist has undergone a plasma treatment sufficient to strengthen the photoresist (e.g., patterned photoresist) against the etching effects of etchants subsequently employed during the fabrication process. In particular, the photoresist monitor system 260 transmits a pulse 275 (e.g., light of an appropriate wavelength as indicated by solid arrows in FIG. 2) onto the patterned photoresist layer 250. This can occur before, during, and/or after the photoresist layer 250 has been exposed to a plasma treatment. The photoresist monitor system 260 can also receive a reflected pulse response 280 (depicted as broken arrows in FIG. 2) from the patterned photoresist layer 250. Pulse responses 280 received prior to the plasma treatment may provide a base level status of the photoresist layer 250 to which pulse responses 280 received during and/or after the plasma treatment may be compared. The photoresist monitor system 260 may perform a pulse comparison between the pulse transmissions 275 and the pulse responses 280 to determine whether a plasma treatment has been administered and whether the plasma treatment has been sufficient to adequately strengthen the photoresist layer 250. Data or numeric values may be set within the monitor 260 to signify whether the patterned photoresist layer 250 has been sufficiently strengthened.

The photoresist monitor system 260 may perform independently of the plasma treatment system 265 as well as in concert with the plasma treatment system 265. For example, the photoresist monitor system 260 may begin monitoring before the plasma treatment device 265 has been activated and/or before a plasma treatment is administered. In addition, the photoresist monitor system 260 may instruct the plasma treatment system 265 to administer another plasma treatment if the prior treatment was insufficient to strengthen the photoresist layer 250 to a desired degree or level. The photoresist monitor system 260 may also adjust the plasma parameters (e.g., plasma power, gas choice and flow rate, pressure, temperature and duration) of the subsequent plasma treatment given the current strength of the photoresist layer 250.

Finally, the output device 270 may display and/or record information regarding the plasma treatment and monitoring process. For example, data relating to the plasma dosage and type of plasma used, pulse transmissions and pulse responses may be recorded and displayed in any usable format.

The photoresist monitor system 260 is described in further detail in FIG. 14 below with respect to its interactions with a wafer undergoing a fabrication process, a plasma treatment system, and one or plasma treatment components.

Figure 3:
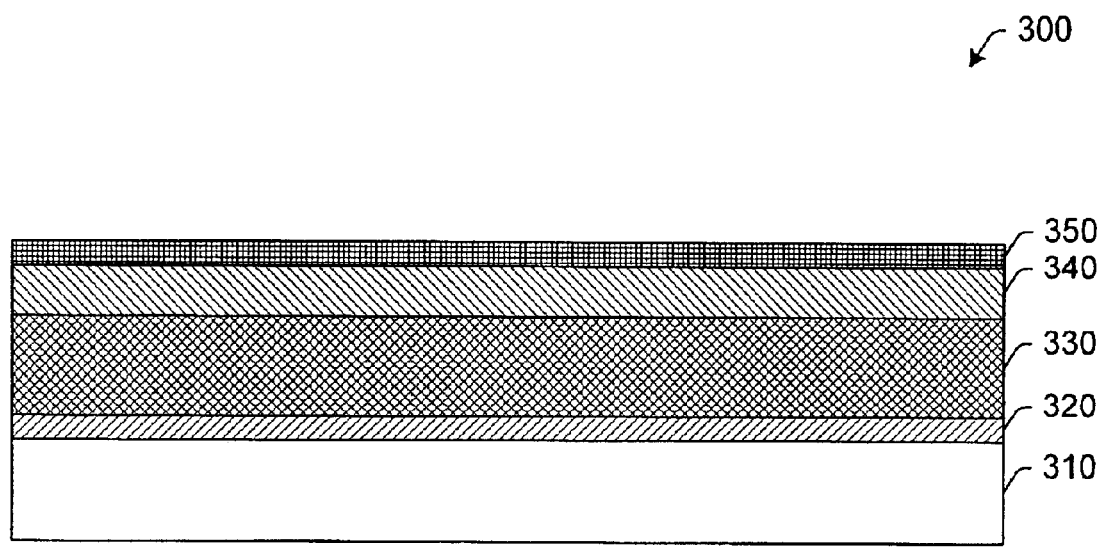
FIG. 3 illustrates a schematic cross-section of a semiconductor structure according to one aspect of the present invention.

Turning now to FIG. 3, a schematic, cross-sectional view of a wafer 300 undergoing semiconductor processing according to one aspect of the present invention is illustrated. The wafer 300 includes a semiconductor substrate 310, a silicon carbonitride layer 320 (SiCN) formed over the substrate 310, a silicon oxycarbide layer 330 (SiOC:H) formed over the silicon carbonitride layer 320, a silicon dioxide layer 340 (SiO₂) formed over the silicon oxycarbide layer 330, and a silicon oxynitride layer 350 (SiON) formed over the silicon dioxide layer 340. It should be appreciated that at least one dielectric layer and one or more dielectric layers are contemplated to be within the scope of the present invention.

Figure 4:
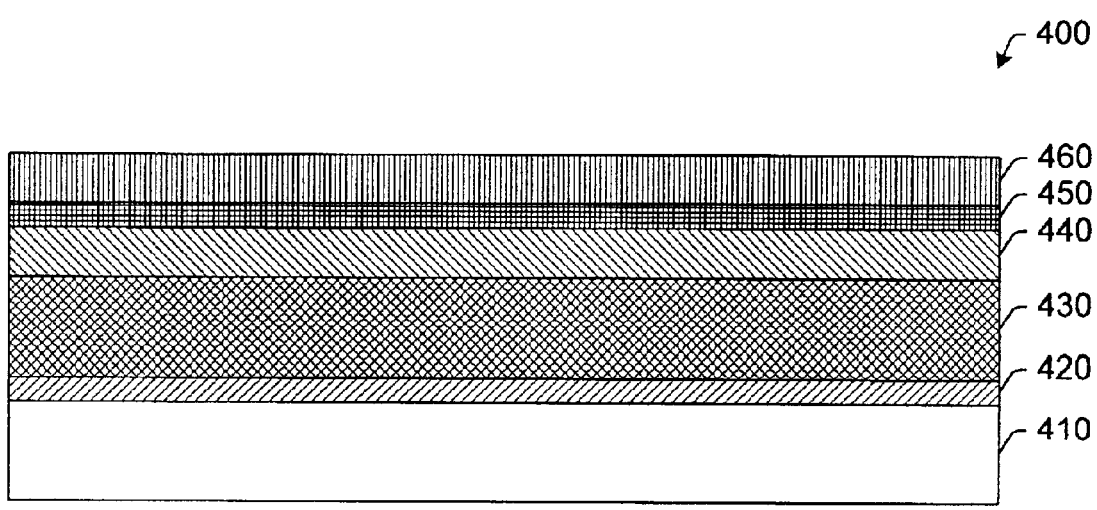
FIG. 4 illustrates a schematic cross-section of a semiconductor structure according to another aspect of the present invention.

FIG. 4 illustrates a schematic, cross-sectional view of a wafer 400 which is similar to the wafer 300 described in FIG. 3 above with respect to a substrate 410, a silicon carbonitride layer 420, a silicon oxycarbide layer 430 (SiOC:H) formed over the silicon carbonitride layer 420, a silicon dioxide layer 440 (SiO₂) formed over the silicon oxycarbide layer 430, and a silicon oxynitride layer 450 (SiON) formed over the silicon dioxide layer 440. The wafer 400 in FIG. 4, however, also depicts a short wavelength photoresist layer 460 formed over the silicon oxynitride layer 450. The photoresist layer may be formed over any other dielectric layer, depending on the desired application using conventional techniques. The short wavelength photoresist has a thickness from about 500 angstroms to about 5000 angstroms.

Figure 5:
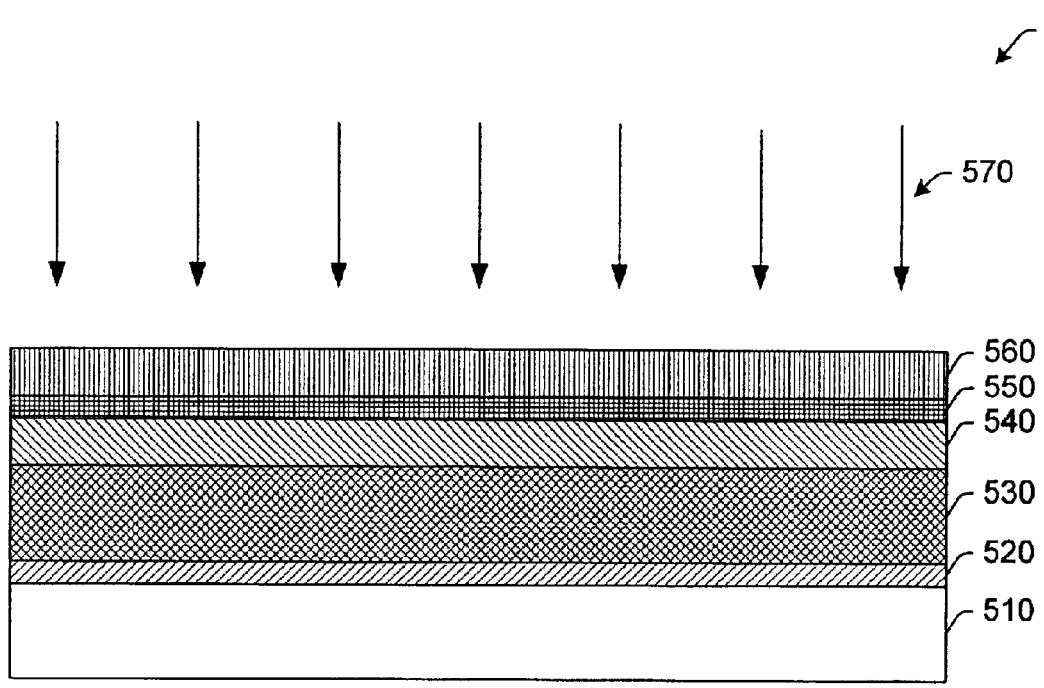
FIG. 5 illustrates a schematic cross-section of a semiconductor structure according to an aspect of the present invention.

FIG. 5 depicts a wafer 500 similar to the wafer 400 as described in FIG. 4 undergoing a semiconductor processing step. In particular, a short wavelength photoresist layer 560 formed over the one or more dielectric layers (520, 530, 540, 550) is being a patterned 570, as indicated by the solid arrows, using 193 nm or lower wavelength radiation. The photoresist layer 560 is being patterned with an image of one or more trenches, thereby exposing portions of the dielectric layer 550 (650 in FIG. 6).

Figure 6:
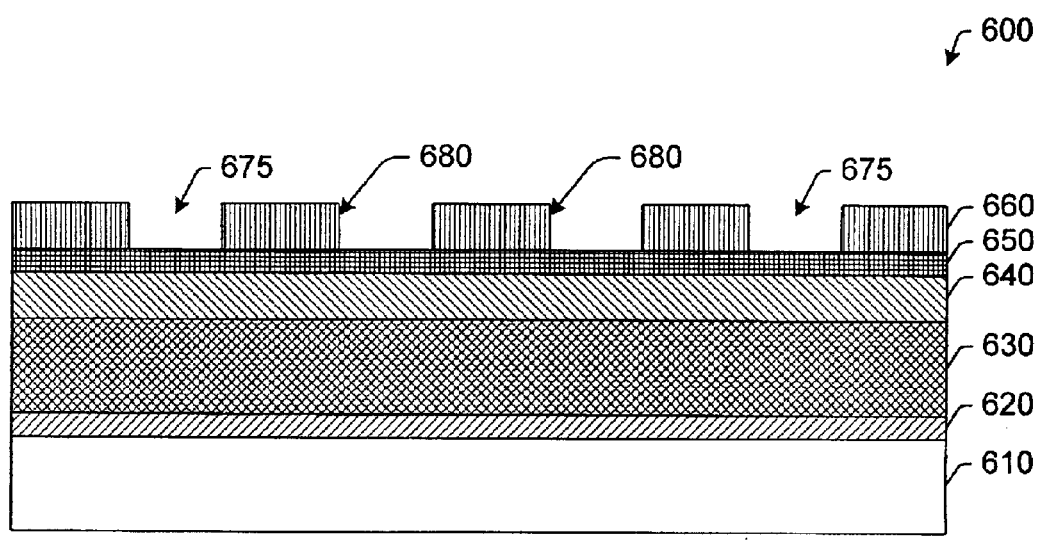
FIG. 6 illustrates a schematic cross-section of a semiconductor structure according to another aspect of the present invention.

FIG. 6 illustrates the resulting trench images 675 formed in a short wavelength photoresist layer 660 on a wafer structure 600. The wafer structure 600 includes a semiconductor substrate 620 and a series of dielectric layers 620, 630, 640, 650 similar to those described in FIGS. 3–5 above. As can be seen in FIG. 6, the sidewalls 680 of the trench images 675 formed in the photoresist layer 660 appear to be substantially smooth which is desirable to facilitate precise trench formation in the underlying layers during subsequent etch processes. In order to preclude and/or mitigate line-edge roughness (LER) and pitting on the sidewalls 680 as well as premature removal of the photoresist layer 660, the wafer structure 600 and particularly the patterned photoresist layer 660 undergo a plasma treatment containing one of helium, argon and hydrogen or a combination thereof as illustrated in FIG. 7.

Figure 7:
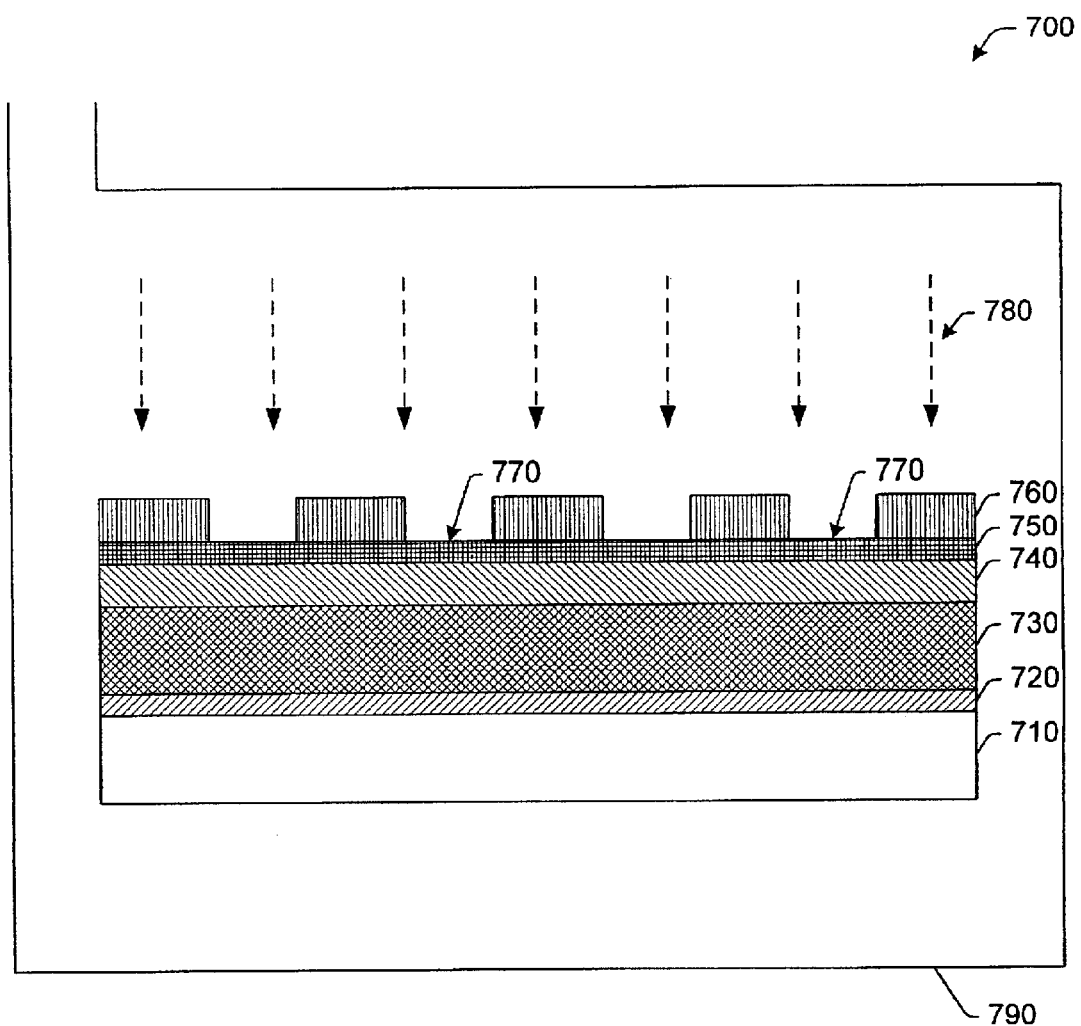
FIG. 7 illustrates a schematic cross-section of a semiconductor structure according to another aspect of the present invention.

FIG. 7 depicts a wafer structure 700 having a semiconductor substrate 710, dielectric layers 720, 730, 740 and 750 similar to those described in FIGS. 3–6, and a patterned photoresist layer 760 as the uppermost layer on at least a portion of the wafer structure 700. The patterned photoresist layer 760 and exposed portions 770 of the silicon oxynitride 750 layer are exposed to a plasma 780 in a chamber 790. The plasma 780 comprises at least one of hydrogen, helium and argon, and any combination thereof. For example, helium plasma was administered at about a 200 sccm gas flow rate and at a 0° C. lower electrode temperature set point with a chamber pressure of about 150 m Torr. Helium backside cooling pressure of about 40 Torr (outer) and about 7 Torr (inner) was also employed. The duration of the plasma treatment was about 20 seconds with about a 47 mm interelectrode gap. It should be understood that similar results may be obtained with other process conditions. The process conditions are selected such that the plasma 780 has no etching effect on the photoresist layer or any other layer (e.g., silicon oxynitride layer 750). The plasma 780 essentially alters the structural nature of the photoresist material for protection against degrading effects of etchants and does not adversely affect the integrity of the wafer structure 700.

The plasma treatment 780 operates to strengthen the patterned photoresist layer 760 in order to mitigate LER which can occur during a subsequent etch process. That is, the etching effects of etchants typically employed during an etch process attack the exposed portions of the underlying layer (e.g., silicon oxynitride 750) in order to remove them, as well as the relatively soft photoresist material during the etch process. As a result, portions of the photoresist may be prematurely and undesirably removed or damaged before the etch process can be completed. This leads to malformed features on or in the silicon oxynitride layer 750, for example. The plasma treatment counteracts the inevitable etching effects of the etchants by reinforcing or strengthening the patterned photoresist layer 760. As a result, the treated photoresist layer 860 (FIG. 8) retains the desired trench shape and configuration in order to facilitate proper trench formation in the underlying dielectric layers.

Figure 8:
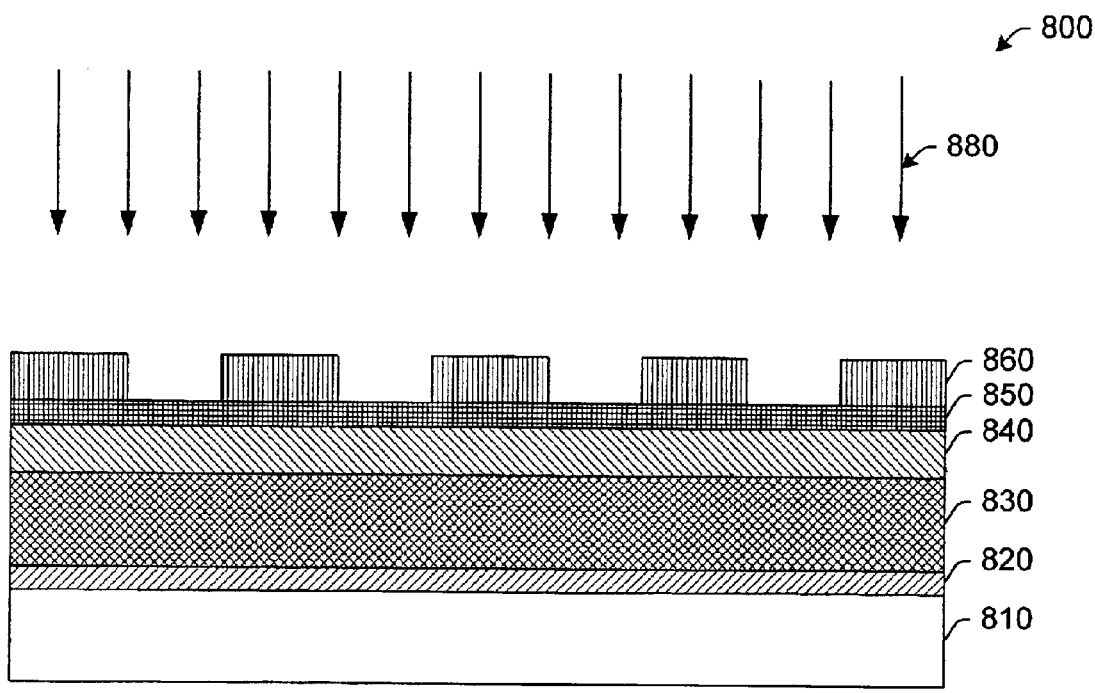
FIG. 8 illustrates a schematic cross-section of a semiconductor structure according to one aspect of the present invention.

Turning now to FIG. 8, a wafer structure 800 is undergoing an etch process as demonstrated by the solid arrows 880. In particular, at least a silicon oxynitride layer 850 is being etching through the openings of a strengthened, patterned photoresist layer 860 using an etchant (e.g., etch plasma or other suitable wet or dry etchant). The strengthened photoresist layer may also be employed to etch one or more of the underlying dielectric layers 840, 830, 820, and/or the substrate 810 depending on the desired application.

Figure 9:
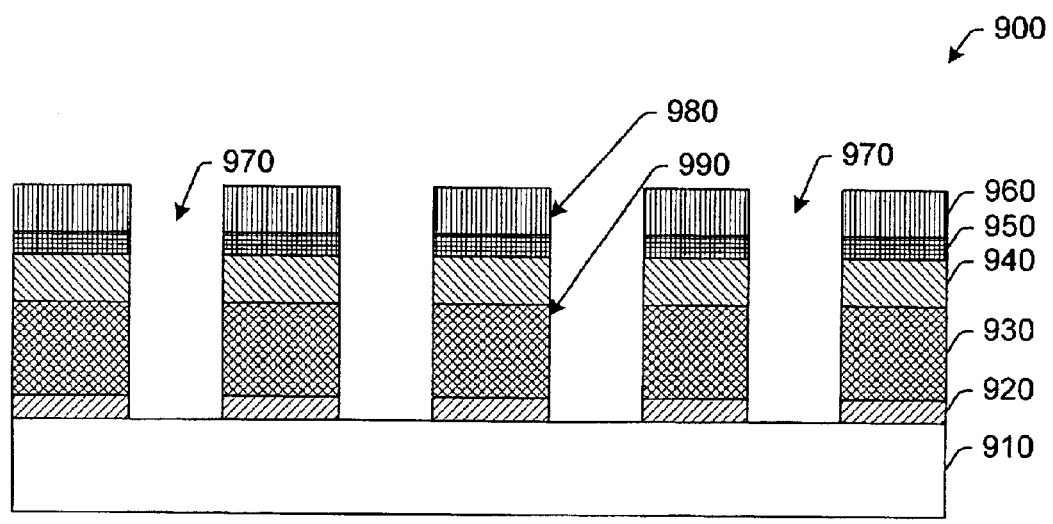
FIG. 9 illustrates a schematic cross-section of a semiconductor structure according to another aspect of the present invention.

FIG. 9 illustrates a partially fabricated semiconductor wafer 900 having selected portions of the dielectric layers 920, 930, 940, 950 etched through a treated photoresist layer 960 to expose a substrate 910. The etch process forms a damascene trench configuration 970. As indicated in the figure, the strengthened photoresist layer 960 has retained its structure throughout and after completion of the previous etch process 880 (FIG. 8), particularly with respect to the sidewalls 980 of the strengthened photoresist layer 960. This is primarily due to the plasma treatment administered to the patterned photoresist layer 760 as described above in FIG. 7. As shown, treating the patterned photoresist layer with a plasma under non-etch process conditions mitigates the occurrence of LER on the photoresist and ultimately on the semiconductor devices 990 formed through the opening of the short wavelength photoresist.

Figure 10:
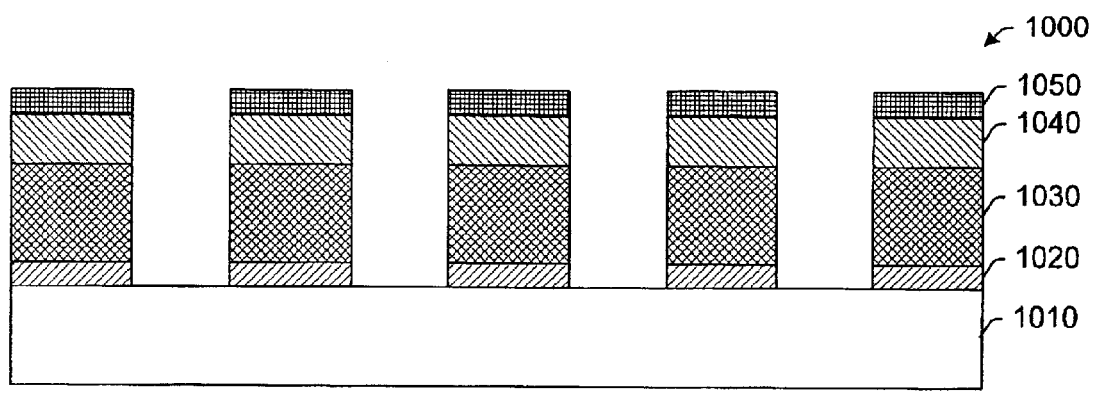
FIG. 10 illustrates a schematic cross-section of a semiconductor structure according to another aspect of the present invention.

In FIG. 10, a schematic, cross-sectional view of a wafer 1000 is illustrated. The wafer 1000 is similar to the wafer 900 as described in FIG. 9. However, a treated photoresist layer 1060 has been removed or stripped away from the wafer 1000, and in particular, from an etched dielectric stack comprising silicon oxynitride layer 1050, silicon dioxide 1040, silicon oxycarbide 1030 and silicon carbonitride 1020. Selected portions of the substrate 1010 are also exposed.

Figure 11:
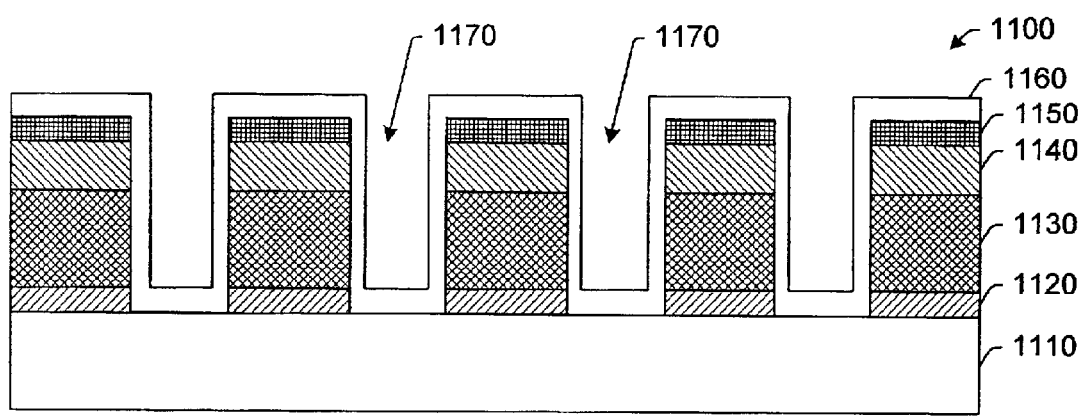
FIG. 11 illustrates a schematic cross-section of a semiconductor structure according to another aspect of the present invention.

FIG. 11 demonstrates a wafer 100 having a conformal barrier or insulating layer 1160 being formed over an etched dielectric stack comprising silicon oxynitride layer 1150, silicon dioxide 1140, silicon oxycarbide 1130 and silicon carbonitride 1120. The conformal layer 1160 contacts selected exposed portions of the substrate 1110.

Figure 12:
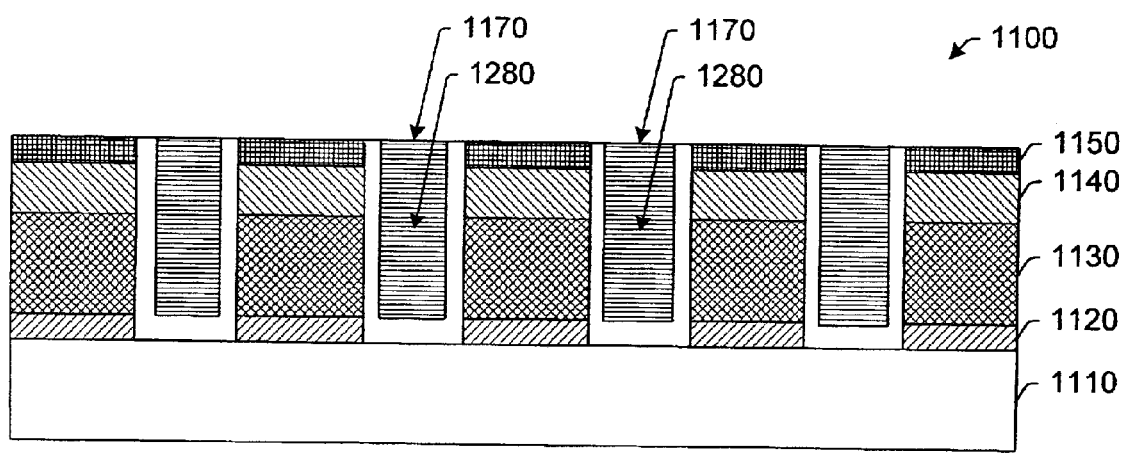
FIG. 12 illustrates a schematic cross-section of a semiconductor structure according to another aspect of the present invention.

To substantially complete a damascene trench structure, trenches 1170 formed in the wafer 1100 are filled with a conductive material 1280 (e.g., copper or copper compound) as illustrated in FIG. 12. Following the fill process, the surface of the wafer 1100 is polished back using a chemical mechanical polishing process suitable to remove the top surface of the conformal barrier layer 1160 and corresponding portions of the fill material 1280.

Figure 13:
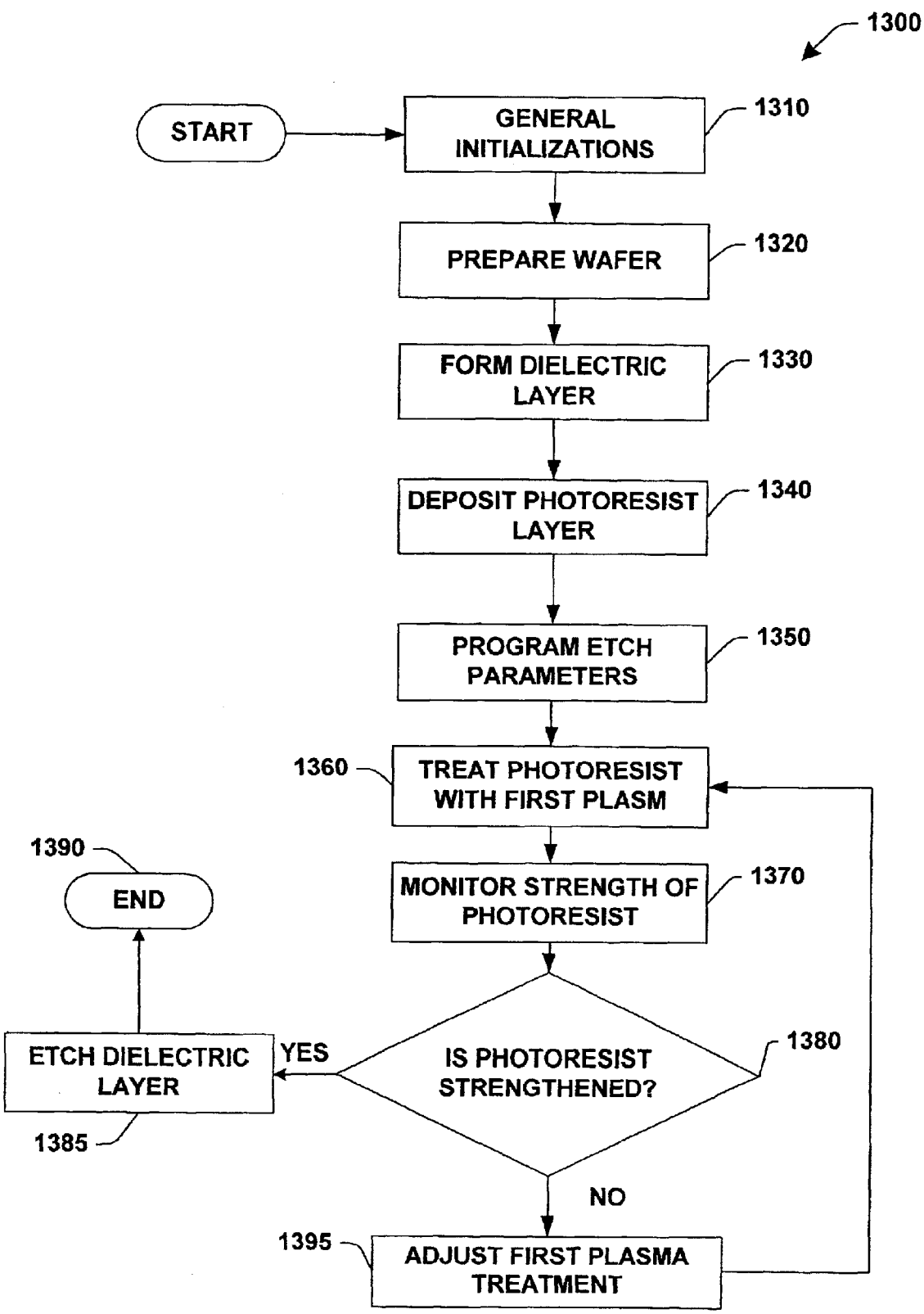
FIG. 13 illustrates a schematic flow diagram of a method for mitigating the occurrence of LER according to one aspect of the present invention.

Turning now to FIG. 13, a flow diagram is shown according to an exemplary method 1300 to mitigate the occurrence of LER in situ on photoresists and ultimately on fabricated semiconductor devices. For example, general initializations are made at 1310 to accommodate a desired process for fabricating semiconductor structures such as a damascene trench pattern. At 1320, the wafer is prepared to undergo the fabrication process, for example, the formation of a damascene trench pattern. Preparation for formation of the trench pattern may include forming one or more base layers underlying a short wavelength photoresist layer, patterning the photoresist layer with the trench image using 193 nm or lower wavelength radiation, strengthening the photoresist layer and etching the underlying layers through openings of the strengthened photoresist layer. Once the wafer is prepared, one or more dielectric layers may be formed over the wafer at 1330. Examples of suitable dielectric layers include silicon dioxide, silicon oxynitride, silicon carbonitride, and silicon oxycarbide. A photoresist having a thickness from about 500 angstroms to about 6000 angstroms can be deposited over the one or more dielectric layers at 1340. An image corresponding to the desired semiconductor feature may be transferred to the short wavelength photoresist using 193 nm or lower radiation.

Appropriate etch parameters for the desired etch process may be programmed at 1350 or any other time during wafer preparation or during the general initializations phase. Examples of etch parameters correspond to desired etch results, known and projected wafer variations, and the like.

At 1360, the patterned photoresist may be exposed to a plasma in order to strengthen it against the etching effects of known etchants to be used in the subsequent etch process. Examples of the plasma include one of hydrogen, argon and helium, or any combination thereof. Before, during, and/or after the photoresist plasma treatment, the strength of the photoresist may be monitored by a photoresist monitor system at 1370. The photoresist monitor system may perform tests on the photoresist layer to determine whether the photoresist layer has been strengthened to a sufficient degree or level. The tests may include transmitting a pulse onto the photoresist layer and then receiving a reflected pulse response from affected portions of the photoresist layer. The reflected pulse response demonstrates signals characteristic of a plasma-treated photoresist in comparison to a non-treated photoresist. Therefore, a response as to whether the photoresist layer has attained a sufficient level of strength to withstand the etching effects of the etchants can be determined in situ almost, if not, immediately during the semiconductor fabrication process (at 1380). This information is fed back to the plasma treatment system or components, particularly when another plasma treatment is desired, in order to initiate another treatment.

If the photoresist has been strengthened to a suitable degree (as determined by the user), the etch process may follow by etching the dielectric layer through the openings of the strengthened, photoresist at 1385. The fabrication process continues from this point (1390).

However, if the photoresist has not been suitably strengthened to withstand the known etching effects of an etchant to be subsequently employed, the plasma treatment may be adjusted accordingly at 1395 and may be repeated (back to 1360) under modified plasma treatment parameters. The photoresist monitor system may determine adjustments and direct their implementation depending on the tested strength of the photoresist layer.

Figure 14:
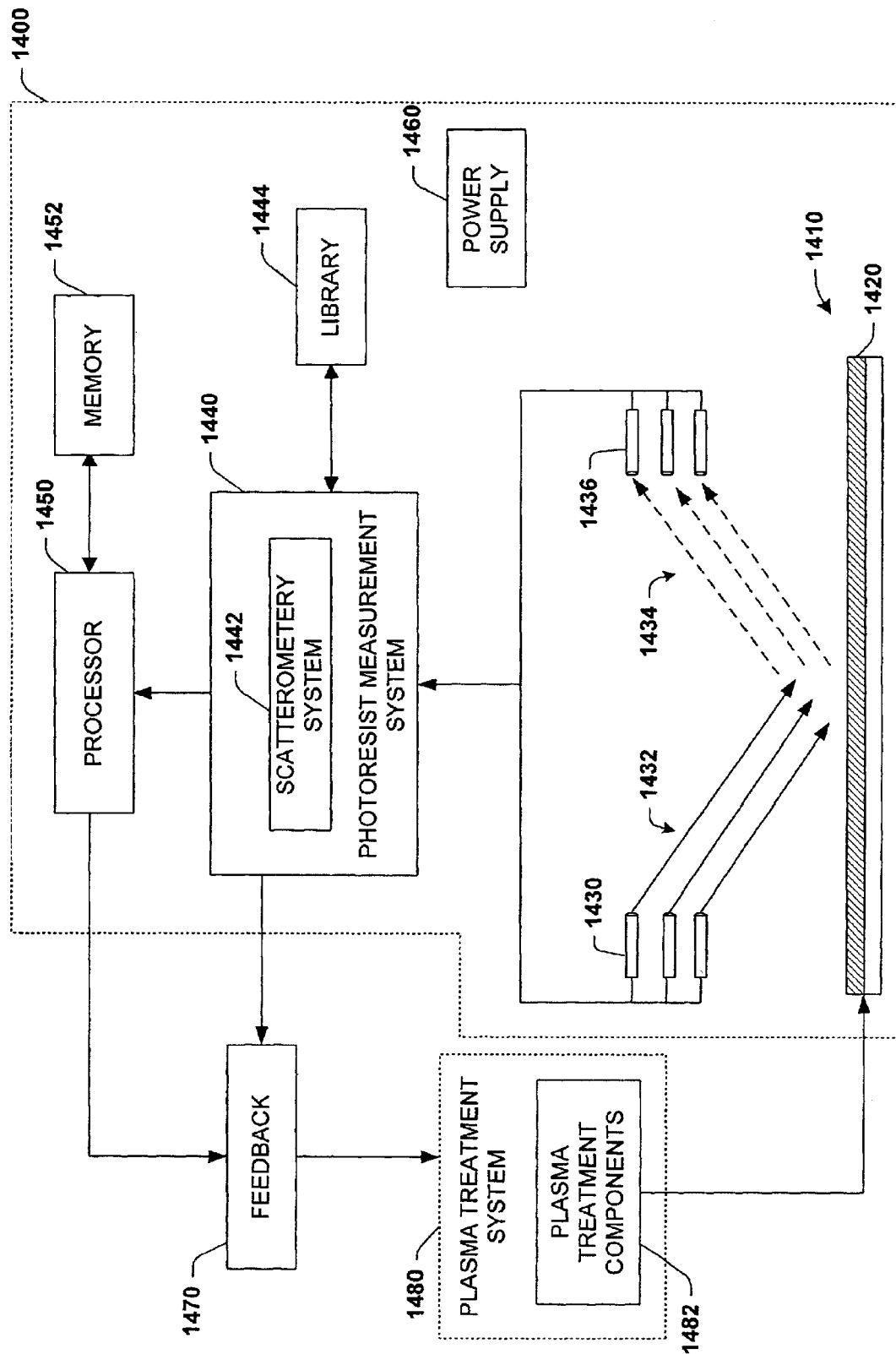
FIG. 14 illustrates an exemplary photoresist monitoring system for mitigating the occurrence of LER according to another aspect of the present invention.

FIG. 14 illustrates a schematic, block diagram of a photoresist monitoring system 1400 for mitigating LER on semiconductor devices according to one aspect of the present invention. In particular, the system 1400 substantially reduces LER on photoresist layers by exposing a patterned photoresist layer to a plasma treatment containing at least one of helium, argon, and hydrogen under non-etch process conditions. The patterned photoresist is formed by using 193 nm or lower radiation to remove portions of the photoresist and to expose portions of an underlying layer. The photoresist monitoring system 1400 includes a wafer 1410, wherein a patterned photoresist 1420 is the upper most layer of the wafer 1410. The wafer 1410 may also include one or more dielectric layers underlying the patterned photoresist 1420.

The wafer 1410 is positioned for being monitored as it proceeds through a semiconductor feature fabrication process. The feature fabrication process involves exposing the patterned photoresist to a plasma treatment in order to strengthen its surface against undesirable etching effects of subsequently employed etchants. The plasma treatment contains at least one of helium, argon, and hydrogen under process conditions not suitable to etch, remove, or damage the exposed photoresist layer 1420 or any other layer exposed through the openings of the photoresist 1420. The photoresist monitoring system 1400 may be employed to monitor at least a portion of the fabrication process before, during, and after the plasma treatment has been administered.

The system also includes a light source 1430 which transmits a pulse of light 1432 at the wafer 1410, and particularly at the surface of the patterned photoresist layer 1420 in order to generate a light scattering signature of the wafer 1410. The light scattering signature is a form of data used to determine whether the patterned photoresist layer has been treated by the plasma and whether the plasma treatment was effective to strengthen the patterned photoresist. Examples of light sources contemplated by the present invention include, but are not limited to, a laser such as a laser diode or a neon gas laser, ultraviolet light, deep ultraviolet light, and the like.

Reflected light responses 1434 from the wafer 1410 are received by receptors 1436 in order to generate the light scattering signature of the wafer 1410. One or more receptors may be used, examples of which include photo diodes and photo detectors. The pulse transmissions 1432 and reflected light responses 1434 are communicated to a photoresist measurement system 1440, which is operatively coupled to the receptors. The photoresist measurement system 1440 analyzes the pulse transmissions 1434 and the reflected light responses 1434. The analysis may be performed in conjunction with a scatterometry system 1442 in order to interpret the light information for the purpose of generating the light scattering signature corresponding to the current state (e.g., strengthened or not strengthened) of the wafer 1410. A spectroscopic ellipsometer may also be used to interpret the light information and is contemplated to fall within the scope of the present invention.

The generated light scattering signature characterizes the "appearance" of the wafer 1410, particularly the surface of the layers (photoresist and exposed portions of underlying layer) exposed to the plasma treatment, in order to determine whether the photoresist layer 1420 has been treated effectively with the plasma treatment. The generated light scattering signature can be recorded and/or stored in a library 1444 containing the pulse transmission and reflected light response information corresponding to the particular signature.

In addition, the photoresist measurement system may be coupled to any one of a plurality of processors 1450, such as the AMD K7, and/or other similar and compatible processors. The manner in which the photoresist measurement system 1440 can be programmed to carry out the functions relating to the present invention will be readily apparent to those having ordinary skill in the art based on the description provided herein. The processor 1450 may also include a memory 1452 either internal or external to the processor 1450 for storing information, data, and measurements corresponding to the current wafer 1410 as well as previously processed and subsequent wafers. Finally, a suitable power supply 1460 is employed such as a battery, electrical input, and the like.

The photoresist monitoring system 1400 also provides feedback control to the system 200 for mitigating LER on semiconductor devices as described above in FIG. 2. More specifically, the photoresist monitoring system 1400 is operatively coupled to the system 200 to feed back information 1470 to a plasma treatment system 1480 (similar to system 200 described in FIG. 2) relating to the wafer undergoing the plasma treatment. For example, the photoresist measurement system 1440 provides information to facilitate determining whether the current wafer 1410 has been strengthened by the plasma treatment by analyzing the surface of the wafer 1410. If the photoresist measurement system 1440 determines that the wafer has not been affected by the plasma treatment, then this information is communicated back to the system 1480, where adjustments to the plasma treatment components 1482 (denoted as 265 in FIG. 2) can be made and implemented for the next plasma treatment. In addition, the plasma treatment system 1480 may discard the wafer 1410 depending on the measured information. Thus, the feedback control provided by the photoresist monitoring system 1400 facilitates the optimization of the plasma treatment system 1480 for mitigating LER.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a means) used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for mitigating line-edge roughness on a semiconductor device comprising:

providing a semiconductor substrate having at least one dielectric layer formed over the semiconductor substrate;

forming a patterned photoresist layer over the at least one dielectric layer; and exposing the photoresist layer to a plasma selective to the patterned photoresist layer to strengthen the patterned photoresist layer without substantially etching the at least one dielectric layer, the plasma comprising any one of hydrogen, helium and argon.

2. The method of claim 1, wherein the at least one dielectric layer is one of silicon dioxide, silicon oxynitride, silicon oxycarbide, silicon nitride, and silicon carbonitride.

3. The method of claim 1, wherein the patterned photoresist layer is formed using about 193 nm wavelength radiation.

4. The method of claim 1, wherein the patterned photoresist layer is formed using about 157 nm wavelength radiation.

5. The method of claim 1, further comprising depositing a metal layer between the photoresist and the at least one dielectric layer, the metal layer remaining substantially intact during exposure to the plasma.

6. The method of claim 1, wherein the plasma is exposed to the photoresist layer under a pressure from about 10mTorr to about 1000 mTorr and at flow rate from about 50 sccm to about 500 sccm.

7. The method of claim 1 further comprising determining whether the photoresist has been strengthened by employing a photoresist monitor system.

8. The method of claim 7, wherein employing a photoresist monitor system to determine whether the photoresist has been strengthened comprises transmitting a pulse at the photoresist, receiving a reflected pulse response from the photoresist and analyzing the reflected pulse response to determine a strength level of the photoresist relative to the photoresist layer before the exposure to the plasma occurred.

9. The method of claim 8, wherein the reflected pulse response indicates one or more signals characteristic of a strengthened photoresist layer.

10. The method of claim 8, wherein the reflected pulse response indicates one or more signals characteristic of a non-strengthened photoresist layer.

11. The method of claim 8, wherein the photoresist monitor system provides feedback information relating to the photoresist layer to a plasma treatment system to optimize the plasma treatment system for the photoresist layer and for subsequent photoresist layers.

12. A method for mitigating line-edge roughness during fabrication of a semiconductor device comprising:

providing a semiconductor substrate having one or more dielectric layers formed thereon;

forming a patterned photoresist layer over at least a portion of the one or more dielectric layers, the patterned photoresist layer being formed by using short wavelength radiation no greater than about 193 nm;

exposing the patterned photoresist layer to a plasma selective to the photoresist layer to strengthen the patterned photoresist layer without substantially etching the one or more dielectric layers, the plasma comprising any one of helium and argon and a combination thereof;

etching the one or more dielectric layers one or more dielectric layers through the treated photoresist layer with an etchant selective to the one or more dielectric layers, whereby the treated photoresist layer is resistant to etching effects of the etchant; and stripping the treated photoresist layer from the one or more etched dielectric layers.

13. The method of claim 12, wherein the patterned photoresist layer is formed by using 157 nm wavelength radiation.

14. The method of claim 12, further comprising depositing a metal layer between the photoresist and the at least one dielectric layer, the metal layer remaining substantially intact during exposure to the plasma.

15. The method of claim 12, wherein the plasma is exposed to the photoresist layer under a pressure from about 100 mTorr to about 350 mTorr and at flow rate from about 150 sccm to about 340 sccm.

16. The method of claim 12 further comprising determining whether the photoresist has been strengthened by employing a photoresist monitor system.

17. The method of claim 16, wherein employing a photoresist monitor system to determine whether the photoresist has been strengthened comprises transmitting a pulse at the photoresist, receiving a reflected pulse response from the photoresist and analyzing the reflected pulse response to determine a strength level of the photoresist relative to the photoresist before the exposure to the plasma occurred.

18. The method of claim 17, wherein the reflected pulse response indicates one or more signals characteristic of a strengthened photoresist layer.

19. The method of claim 17, wherein the reflected pulse response indicates one or more signals characteristic of a non-strengthened photoresist layer.

20. The method of claim 16, wherein the photoresist monitor system provides feedback information relating to the photoresist layer to a plasma treatment system to optimize the plasma treatment system for the photoresist layer and for subsequent photoresist layers.

21. The method of claim 12, wherein the one or more dielectric layers is one of silicon dioxide, silicon oxynitride, silicon oxycarbide, silicon nitride, and silicon carbonitride.

22. A method for mitigating line-edge roughness in situ during fabrication of a damascene trench on a semiconductor device comprising:

providing a semiconductor substrate having one or more dielectric layers comprising a silicon dioxide layer, a silicon oxynitride layer, a silicon oxycarbide layer, a silicon nitride layer, and a silicon carbonitride layer formed thereon;

forming a patterned photoresist layer over at least a portion of the one or more dielectric layers, the patterned photoresist layer being formed using short wavelength radiation no greater than 193 nm;

exposing the patterned photoresist layer to a plasma selective to the photoresist layer to strengthen the patterned photoresist layer without substantially etching the one or more dielectric layers and the substrate, the plasma comprising at least one of hydrogen and argon;

determining whether the photoresist layer has been strengthened by the plasma by employing a photoresist monitor system, comprising transmitting a pulse at the photoresist, receiving a reflected pulse response from the photoresist and analyzing the reflected pulse response to determine a strength level of the photoresist relative to the photoresist before the exposure to the plasma occurred;

etching the at least one dielectric layer through the treated photoresist layer with an etchant selective to the at least one dielectric layer, whereby the treated photoresist layer is resistant to etching effects of the etchant; and stripping the treated photoresist layer from the one or more dielectric layers;

depositing a conformal barrier layer over the one or more dielectric layers;

polishing back the barrier layer such that selected portions of the barrier layer have been removed from a top surface of the one or more dielectric layers; and filling the at least one trench with a conductive material.

23. The method of claim 22, wherein the patterned photoresist layer is formed using about 157 nm wavelength radiation.

24. The method of claim 22, wherein the photoresist layer is exposed to the plasma under a pressure from about 110 mTorr to about 190 mTorr and at flow rate from about 160 sccm to about 240 sccm.

25. The method of claim 24, wherein the reflected pulse response indicates one or more signals characteristic of a strengthened photoresist layer.

26. The method of claim 24, wherein the reflected pulse response indicates one or more signals characteristic of a non-strengthened photoresist layer.

* * * * *